(12) United States Patent
Multrus et al.

(10) Patent No.: US 8,547,255 B2
(45) Date of Patent: Oct. 1, 2013

(54) METHOD FOR ENCODING A SYMBOL, METHOD FOR DECODING A SYMBOL, METHOD FOR TRANSMITTING A SYMBOL FROM A TRANSMITTER TO A RECEIVER, ENCODER, DECODER AND SYSTEM FOR TRANSMITTING A SYMBOL FROM A TRANSMITTER TO A RECEIVER

(75) Inventors: Markus Multrus, Nuremberg (DE); Nikolaus Rettelbach, Nuremberg (DE); Stefan Bayer, Nuremberg (DE); Bernhard Grill, Lauf (DE); Manuel Jander, Erlangen (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 249 days.

(21) Appl. No.: 13/004,374

(22) Filed: Jan. 11, 2011

(65) Prior Publication Data
US 2011/0200125 A1     Aug. 18, 2011

Related U.S. Application Data

(63) Continuation of application No. PCT/EP2009/004718, filed on Jun. 30, 2009.

(60) Provisional application No. 61/079,853, filed on Jul. 11, 2008.

(51) Int. Cl.
*H03M 7/00* (2006.01)

(52) U.S. Cl.
USPC ............................................. 341/50; 341/51

(58) Field of Classification Search
USPC ..................... 341/50, 51; 707/102; 704/229, 704/500
See application file for complete search history.

(56) References Cited

U.S. PATENT DOCUMENTS

| 5,408,234 | A | 4/1995 | Chu |
| 6,622,145 | B2 * | 9/2003 | Kerofsky ............................. 1/1 |
| 7,443,320 | B2 | 10/2008 | Lim et al. |

(Continued)

FOREIGN PATENT DOCUMENTS

| CN | 1787384 | 6/2006 |
| EP | 0393526 B2 | 4/1990 |

(Continued)

OTHER PUBLICATIONS

Henke, Robert, "Simulation Eines Audio-Codierverfahrens Fur Professionelle Andwendugen", Thesis; Friedrich-Alexander Universitaet Erlangen-Nuernberg, Erlangen, Dec. 22, 1992.

(Continued)

*Primary Examiner* — Jean B Jeanglaude
(74) *Attorney, Agent, or Firm* — Michael A. Glenn; Perkins Coie LLP

(57) ABSTRACT

In a method for encoding a symbol it is determined whether the symbol can be encoded by a codeword of a first codebook. In case this is true, the appropriate codeword for the symbol is selected from the first codebook. Otherwise, a codeword is selected from the first codebook indicating that the symbol cannot be encoded by a codeword of the first codebook and the symbol is split into a plurality of first sub-symbols and for at least one of the first sub-symbols a codeword is selected from a second codebook. Also a corresponding method for decoding is described.

18 Claims, 13 Drawing Sheets

(ENCODER)

(DECODER)

(56) References Cited

U.S. PATENT DOCUMENTS

| | | | | |
|---|---|---|---|---|
| 2002/0173969 | A1* | 11/2002 | Ojanpera | 704/500 |
| 2003/0009328 | A1* | 1/2003 | Ojanpera | 704/229 |
| 2003/0018648 | A1* | 1/2003 | Kerofsky | 707/102 |
| 2006/0106870 | A1 | 5/2006 | Franaszek et al. | |

FOREIGN PATENT DOCUMENTS

| | | |
|---|---|---|
| JP | 2005-065312 | 3/2005 |
| JP | 2005-175944 | 6/2005 |
| TW | 584835 | 4/2004 |
| TW | I242935 | 11/2005 |
| TW | I246255 | 12/2005 |

OTHER PUBLICATIONS

English Translation of Chapter 3 for the Non Patent Literature submitted on Sep. 9, 2011.

PCT/EP2009/004718 International Search Report and Written Opinion; 16 pages; mailed date Jul. 12, 2009.

Brandenburg, K. et al., "Near-Lossless Coding of High Quality Digital Audio: First Results", IEEE Int'l Conference on Acoustics, Speech and Signal Processing, vol. 1, Apr. 27, 1993, pp. 193-196.

Henke, Robert, "Simulation Eines Audio-codierverfahrens Fur Professionelle Andwendugen", Thesis; Friedrich-Alexander Universitaet Erlangen-Nuernberg, Erlangen, Dec. 22, 1992, 129 pages.

Hoang, Dzung T. et al., "Multiple-Dictionary Compression Using Partial Matching", IEEE Data Compression Conference, Mar. 28, 1995, pp. 272-281.

Huffman, David A., "A Method for the Construction of Minimum-Redundancy Codes", Proceedings of the I.R.E., vol. 40, Issue 9, Sep. 1952, pp. 1098-1101.

ITU-T, , "Standardization of Group 3 Facsimile Terminals for Document Transmission", ITU-T International Telecommunication Union, Series T: Terminals for Telematic Servicers; ITU-T Recommendation T.4, Jul. 2003; 78 pages.

ITU-T, , "Video Coding for Low Bit Rate Communication", ITU-T H-Series Recommendations Audiovisual and Multimedia Systems, Itu-T Recommendation H.263, Jan. 2005; 226 pages.

* cited by examiner

| Symbol | Codeword |
|---|---|
| ESC16 | 0 |
| 0000 0000 0000 0000 | 10 |
| 0000 0000 0000 0001 | 11 0 0000 |
| 0000 0000 0000 0010 | 11 0 0001 |
| 0000 0000 0000 0100 | 11 0 0010 |
| 0000 0000 0000 1000 | 11 0 0011 |
| 0000 0000 0001 0000 | 11 0 0100 |
| 0000 0000 0010 0000 | 11 0 0101 |
| 0000 0000 0100 0000 | 11 0 0110 |
| 0000 0000 1000 0000 | 11 0 0111 |
| 0000 0001 0000 0000 | 11 0 1000 |
| 0000 0010 0000 0000 | 11 0 1001 |
| 0000 0100 0000 0000 | 11 0 1010 |
| 0000 1000 0000 0000 | 11 0 1011 |
| 0001 0000 0000 0000 | 11 0 1100 |
| 0010 0000 0000 0000 | 11 0 1101 |
| 0100 0000 0000 0000 | 11 0 1110 |
| 1000 0000 0000 0000 | 11 0 1111 |
| 0000 0000 0000 000-1 | 11 1 0000 |
| 0000 0000 0000 00-10 | 11 1 0001 |
| 0000 0000 0000 0-100 | 11 1 0010 |
| 0000 0000 0000 -1000 | 11 1 0011 |
| 0000 0000 000-1 0000 | 11 1 0100 |
| 0000 0000 00-10 0000 | 11 1 0101 |
| 0000 0000 0-100 0000 | 11 1 0110 |
| 0000 0000 -1000 0000 | 11 1 0111 |
| 0000 000-1 0000 0000 | 11 1 1000 |
| 0000 00-10 0000 0000 | 11 1 1001 |
| 0000 0-100 0000 0000 | 11 1 1010 |
| 0000 -1000 0000 0000 | 11 1 1011 |
| 000-1 0000 0000 0000 | 11 1 1100 |
| 00-10 0000 0000 0000 | 11 1 1101 |
| 0-100 0000 0000 0000 | 11 1 1110 |
| -1000 0000 0000 0000 | 11 1 1111 |

FIG 2A

| Symbol | Codeword |
|---|---|
| ESC8 | 0 |
| 0000 0000 | 10 |
| 0000 0001 | 11 0 000 |
| 0000 0010 | 11 0 001 |
| 0000 0100 | 11 0 010 |
| 0000 1000 | 11 0 011 |
| 0001 0000 | 11 0 100 |
| 0010 0000 | 11 0 101 |
| 0100 0000 | 11 0 110 |
| 1000 0000 | 11 0 111 |
| 0000 000-1 | 11 1 000 |
| 0000 00-10 | 11 1 001 |
| 0000 0-100 | 11 1 010 |
| 0000 -1000 | 11 1 011 |
| 000-1 0000 | 11 1 100 |
| 00-10 0000 | 11 1 101 |
| 0-100 0000 | 11 1 110 |
| -1000 0000 | 11 1 111 |

FIG 2B

| Symbol (S$_0$, S$_1$, S$_2$, S$_3$) | Codeword (CW4) |
|---|---|
| ESC4 | xxxx (unique codeword) |
| 0001 | 0001 |
| 0010 | 0010 |
| ⋮ | ⋮ |
| 1111 | 1111 |
| 0000 | 0000 |
| 000-1 | 000-1 |
| 00-10 | 00-10 |
| ⋮ | ⋮ |
| -1-1-1-1 | -1-1-1-1 | in case all values of S$_0$, S$_1$, S$_2$, S$_3$ ≠ [-1,0,1]: transmit only ESC4 in case same values of S$_0$, S$_1$, S$_2$, S$_3$ ≠ [-1,0,1]: replace respective value(s) by ESC4

Example :   S = [-2, 3, 4,-5] => CW4 = ESC4
S = [-1, 3, 0,-5] => CW4 = {-1, ESC4, 0, ESC4}

FIG 2C

| Symbol | Codeword |
|---|---|
| 0000 ... 0000 | CW1 10 |
| else | CW2 11 $X_1$ $X_2$ $X_3$ $X_4$ |

$x_n$ (n=1,2,3,4) = "0"
in case sub-symbols 1,2,3 or 4
includes only "0"
$x_n$ (n=1,2,3,4) = "1" else

FIG 5

Level L=0 : C(0,0) = ESC16
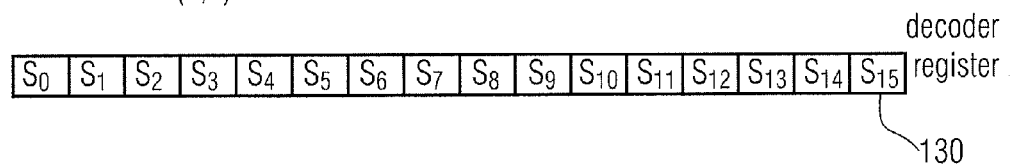
Level L=1 : C(1,0) = CW8 ($S_0, S_1, S_2, S_3, S_4, S_5, S_6, S_7$)
         C(1,1) = ESC8
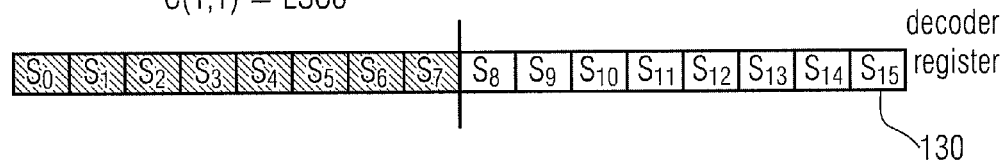
Level L=2 : C(2,0) = CW4 (ESC4, $S_9$, $S_{10}$, ESC4)
         C(2,1) = ESC4
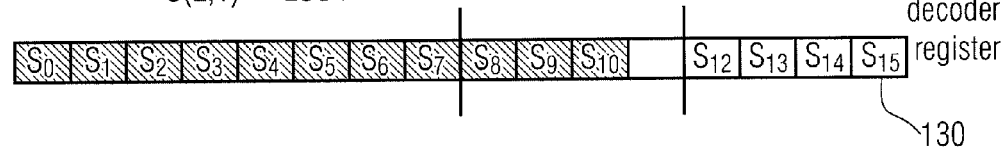
Level L=3 : C(3,0) = CW1 ($S_8$)
         C(3,1) = CW1 ($S_{10}$)
         C(3,2) = CW1 ($S_{12}$)
         C(3,3) = CW1 ($S_{13}$)
         C(3,4) = CW1 ($S_{14}$)
         C(3,5) = CW1 ($S_{15}$)
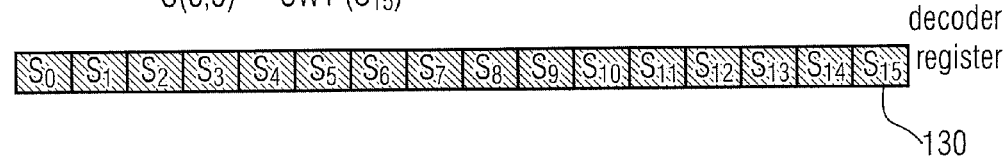
FIG 7

Level 0 : C(0,0) = CW2 (111011)
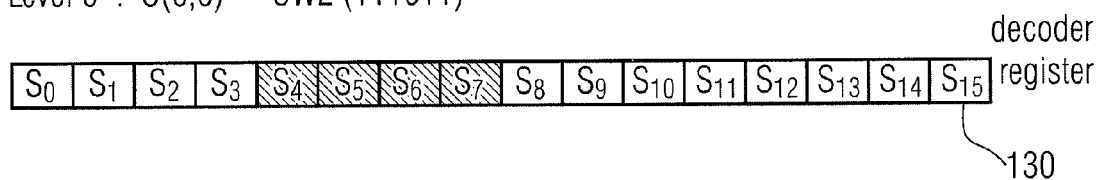
Level 1 : C(1,0) = CW3
C(1,2) = CW5
C(1,3) = CW6
FIG 8

(ENCODER)

FIG 10 (DECODER)

METHOD FOR ENCODING A SYMBOL, METHOD FOR DECODING A SYMBOL, METHOD FOR TRANSMITTING A SYMBOL FROM A TRANSMITTER TO A RECEIVER, ENCODER, DECODER AND SYSTEM FOR TRANSMITTING A SYMBOL FROM A TRANSMITTER TO A RECEIVER

CROSS-REFERENCE TO RELATED APPLICATIONS

This application is a continuation of copending International Application No. PCT/EP2009/004718, filed Jun. 30, 2009, which is incorporated herein by reference in its entirety, and additionally claims priority from U.S. application No. 61/079,853, filed Jul. 11, 2008, which is incorporated herein by reference in its entirety.

BACKGROUND OF THE INVENTION

The invention relates to the field of encoding/decoding a symbol and, more specifically, a method for encoding a symbol comprising a plurality of values, a method for decoding a symbol comprising a plurality of values and being encoded by one or more codewords, a method for transmitting a symbol from a transmitter to a receiver, a computer program for performing the method in accordance with the invention, an encoder, a decoder and a system for transmitting a symbol from a transmitter to a receiver. More specifically, embodiments of the invention relate to a new entropy encoding/decoding method which is based on Huffman coding and uses multi-dimensional codewords to take advantage of statistical dependencies between neighboring symbols and to adapt the codeword length better to symbol probabilities.

In the art various methods for coding signals are known for coding audio and video signals or are used for coding processes in a telecommunication environment. Also corresponding decoding approaches are known. For example, in the field of audio coding AAC/MP3 uses modified (or stacked) Huffman codes according to Henke, Robert, "Simulation eines Audiocodierverfahrens für professionelle Anwendungen", Diplomarbeit, Friedrich-Alexander Universität Erlangen-Nürnberg, Erlangen 1992, Brandenburg, Karlheinz, Henke, Robert, "Near-Lossless Coding of High Quality Digital Audio: First Results", ICASSP-93, IEEE International Conference on Acoustics, Speech, and Signal Processing, vol. 1, Apr. 27-30, 1993, pages 193-196, and EP 0 393 526 A.

Huffman codes are used to encode the quantized spectral coefficients. Spectral coefficients can be obtained from a time domain signal by means of a filter bank or transformation. In state-of-the-art audio coding, typically an MDCT is used as transformation (MDCT=modified discrete cosine transformation). For quantization typically a scalar quantizer is used. In case Huffman codes are used to encode quantized spectral values, a single or multiple quantized spectral values are referred to as symbol. Symbols mapped to Huffman codes are restricted in the range of values to a largest absolute value (LAV), as is described by Huffman, D. A., "A Method for the Construction of Minimum-Redundancy Codes", Proceedings of the IRE, September 1952, vol. 40, issue 9, pages 1098-1101. For example, in AAC coding in case a symbol exceeds the LAV the symbol is not mapped to a single codeword but to a sequence of two codewords. One of the codewords is the so-called "escape sequence" which signals the presence of an additional codeword. The second codeword is the so-called "terminating codeword". On the decoder side the symbol can only be decoded using all of the codewords from the sequence, namely the escape codeword and the terminating codeword. The terminating codeword is typically run-length coded using a modified Golomb-Code and signals the difference between the largest absolute value and the value of the coded symbol. The dimensionality of symbols is restricted to a maximum of four, i.e. a maximum of four neighboring spectral coefficients are combined for one symbol. Thus, the dimensionality of a symbol indicates the number of values which are combined into one symbol for which then a codeword is determined for transmission to a decoder. The escape mechanism is used per spectral coefficient, not per symbol, i.e. in case one spectral coefficient exceeds the LAV and the rest of the spectral coefficients do not, an escape mechanism is used only for the spectral coefficient exceeding the LAV.

In the field of video coding in accordance with the ITU-T video coding specification ITU-T H.263 (01/2005) a combination of a one-dimensional Huffman coding (VLC=Variable Length Coding) and an escape mechanism is used. This mechanism is used to encode quantized DCT (DCT=discrete cosine transformation) coefficients in a similar manner as is done in audio coding approaches. In the field of telecommunications the ITU-T telefax specification (ITU-T Rec. T.4 (07/2003)) describes the use of modified Huffman codes, i.e. run-lengths are encoded using Huffman coding. In case a run-length exceeds the LAV a so-called "mark-up-code" is transmitted. By means of this mark-up-codes integer multiples of 64 can be represented. At run-lengths being greater than 63 the next smaller mark-up-code is transmitted. The difference to the original run-length is sent as terminating codeword.

The above described approaches of conventional technology based on Huffman coding restrict the dimensionality and the range of values for the symbol to keep memory requirements low. In addition, it is needed to keep the Huffman codebooks or codeword tables small so that the codewords comprise a length which does not exceed a predefined limit so that transmission of the codewords can be done in accordance with preset conditions. In case single values exceed the range of values escape mechanism are used for these single symbols.

By restricting the symbol dimensionality the codeword lengths are, in general, not optimal.

For binary Huffman coding, only symbol probabilities p of $(1/2)^n$ can be encoded optimally using Huffman codes, since the resulting codeword length 1 is restricted to an integer value. If $H(p)$ is the symbol entropy, the following restriction applies: $H(p) \leq 1 < H(p)+1$. The negative effects of this restriction can be alleviated by increasing the symbol dimensionality to N: $1/N \cdot H(p) \leq 1 < H(p)+1/N$. However, especially for low data rates multi-dimensional symbols having a probability of more than 0.5 may occur and for such symbols the optimal symbol dimensionality would than be for example 16. However, a 16-dim table with four values per sub-symbol would need a memory to store $4^{16}=4294967296=2^{32}$ codewords and codeword lengths which would have a big impact on memory requirements. Also, the codeword length would exceed for many of the codewords an acceptable range.

Multi symbol code words are beneficial if the symbols to be coded have statistical dependencies. Such statistical dependencies may result e.g. from the characteristics of the frequency transform and the analysis window used.

For two statistically independent symbols the conditional probability that b follows a is $P(a|b)=P(a) \cdot P(b)$ resulting in an optimal code length $L(a|b)=L(a)+L(b)$ being the sum of the optimal code words of the single symbols, whereas for statistically dependent symbols the conditional probability will be different. For example, if the there is a high probability that symbol b follows symbol a then the conditional probability $P(a|b) > P(a) \cdot P(b)$ will be higher than for the statistically independent case and accordingly, the optimal code length $L(a|b) < L(a) + L(b)$ will be shorter than the sum of the two independent optimal code word lengths $L(a)$ and $L(b)$.

The higher the dimensionality of the code book used, the higher the order of dependent probability $P(a|b|c| \ldots)$ that can be captured.

SUMMARY

According to an embodiment, a method for encoding an original symbol having a plurality of values may have the steps of (a) determining whether the symbol can be encoded by a codeword of a first codebook; (b) in case the symbol can be encoded by a codeword of the first codebook, selecting the codeword associated with the symbol from the first codebook; and (c) in case the symbol cannot be encoded by a codeword of the first codebook: selecting a codeword from the first codebook indicating that the symbol cannot be encoded by a codeword of the first codebook, splitting the symbol into a plurality of first sub-symbols, each of the first sub-symbols having a predefined number of values of the original symbol, and selecting a codeword for each of the first sub-symbols from a second codebook, wherein the encoded symbol is represented by the one or more selected codewords.

According to another embodiment, a method for decoding an original symbol having a plurality of values and being encoded by one or more codewords may have the steps of (a) determining whether a first codeword can completely represent the symbol using a first codebook; (b) in case the first codeword can completely represent the symbol using the first codebook, selecting the symbol from the first codebook using the first codeword; and (c) in case the first codeword cannot completely represent the symbol using the first codebook, selecting a second codebook for decoding first sub-symbols of the symbol, wherein each of the first sub-symbols has a predefined number of values the original symbol, and selecting an entry for each of the first sub-symbols from the second codebook using a second codeword, wherein the symbol is represented by the values associated with the one or more selected codewords.

According to another embodiment, a method for transmitting a symbol from a transmitter to a receiver may have the steps of encoding the symbol the first above mentioned method, transmitting the selected codewords from the transmitter to the receiver, decoding the received codewords according to the second above mentioned method to acquire the symbol; and providing the symbol for further processing.

According to another embodiment, a computer program for may perform, when running on a computer, one of the above mentioned methods.

According to another embodiment, an encoder may have an input for receiving an input signal having a symbol; an encoder circuit for encoding the symbol from the input signal, wherein the encoder circuit is configured to encode the symbol in accordance with the first above mentioned method; and an output for providing an output signal having the selected codewords representing the symbol.

According to another embodiment, a decoder may have an input for receiving an input signal having a plurality of codewords representing a symbol; a decoder circuit for decoding the codewords from the input signal, wherein the decoder circuit is configured to decode the codewords in accordance with the second above mentioned method; and an output for providing an output signal having the symbol.

According to another embodiment, a system for transmitting a symbol, from a transmitter to a receiver may have an above mentioned encoder; a transmitter coupled to the encoder; a communication link coupled to the transmitter; a receiver coupled to the communication link; and an above mentioned decoder coupled to the receiver.

The present invention provides a method for encoding a symbol comprising a plurality of values, the method comprising:
(a) determining whether the symbol can be encoded by a codeword of a first codebook;
(b) in case the symbol can be encoded by a codeword of the first codebook, selecting the codeword associated with the symbol from the first codebook; and
(c) in case the symbol cannot be encoded by a codeword of the first codebook:
   selecting a codeword from the first codebook indicating that the symbol cannot be encoded by a codeword of the first codebook,
   splitting the symbol into a plurality of first sub-symbols, and
   selecting a codeword for at least one of the first sub-symbols from a second codebook.

In accordance with a first aspect of the invention the method for encoding comprises step (d) in accordance with which for each first sub-symbol that cannot be encoded by a codeword from the second codebook the first sub-symbol is split into a plurality of second sub-symbols, and a codeword is selected for at least one of the second sub-symbols from a third codebook, wherein at step (c) a codeword is selected from the second codebook for each of the first sub-symbols, and at step (d) a codeword is selected from the second codebook indicating that a first sub-symbol cannot be encoded by a codeword of the second codebook, and a codeword is selected from the third codebook for each of the second sub-symbols.

In accordance with a second aspect of the invention at step (c) the codeword selected from the first codebook further indicates which of the first sub-symbols comprises a predefined combination of values, and at step (c) for those first sub-symbols not comprising the predefined combination of values a codeword is selected from the second codebook.

The present invention further provides a method for decoding a symbol comprising a plurality of values and being encoded by one or more codewords, the method comprising:
(a) determining whether a first codeword can completely represent the symbol using a first codebook;
(b) in case the first codeword can completely represent the symbol using the first codebook, selecting the symbol from the first codebook using the first codeword; and
(c) in case the first codeword cannot completely represent the symbol using the first codebook,
   selecting a second codebook for decoding first sub-symbols of the symbol which comprises a plurality of sub-symbols, and
   selecting an entry for at least one of the first sub-symbols from the second codebook using a second codeword.

In accordance with the first aspect of the invention the method for decoding comprises step (d) in accordance with which in case the second codebook cannot completely represent one of the first sub-symbols a third codebook is selected for decoding second sub-symbols of the one first sub-symbol which comprises a plurality of second sub-symbols, and an entry is selected for at least one of the second sub-symbols from the third codebook using a third codeword, wherein at step (c) the first codebook indicates for the first codeword that the symbol cannot be decoded from the first codebook, and for each of the first sub-symbols an entry is selected from the second codebook, and at step (d) the second codebook indicates for a second codeword of a first sub-symbol that the first sub-symbol cannot be decoded by the second codebook, and for each of the second sub-symbols an entry is selected from the third codebook.

In accordance with the second aspect of the invention at step (c) the first codebook indicates for the first codeword that the symbol cannot be decoded from the first codebook and which of the first sub-symbols comprises a predefined combination of values, and at step (c) for those sub-symbols not comprising the predefined combination of values an entry is selected from the second codebook.

Embodiments of the present invention provide a flexible, hierarchical and multi-dimensional Huffman coding scheme that allows extending the symbol dimensionality with only a minor increase in memory demand. This is achieved by introducing multi-dimensional symbols with only a limited range of values and (in general) multi-dimensional escape sequences. These escape mechanisms can be applied to single or multiple sub-symbols. All sub-symbols which cannot be encoded directly are marked with an escape code and a new coding step is performed. This process is repeated hierarchically until all sub-symbols are encoded. For example, for the next hierarchical step either the range of values at the same codeword dimensionality is increased, or the codeword dimensionality is decreased at the same range of values, or the codeword range of values is increased and the codeword dimensionality is decreased.

The inventive approach is advantageous over conventional approaches, as the increase in symbol dimensionality allows for a better adaption of the codeword length to the symbol probabilities and for a better exploitation of statistical dependencies between neighboring sub-symbols. In addition, statistical dependencies between neighboring sub-symbols, which are not in the range of values, can be exploited.

Using multi dimensional escape sequences will further reduce the memory requirements for multi dimensional code books. For example to allow for a 16-dimensional codebook representing the value 0 directly and values not being 0 via an escape sequence, the number of code words would be $2^{16}=65536$, whereas having escape sequences for 4 neighboring symbols and a subsequent 4 dimensional code book with per symbol escape sequence would reduce the number of entries to $2^4+2^4=16$ only.

If a combination of symbols can not be represented directly in a multidimensional code book due to the codebooks limited range, multidimensional escape sequences will allow for exploiting lower order statistical dependencies present in the lower dimensional sub symbols.

Embodiments of the invention are used in the field of entropy coding, audio/video coding and telecommunications.

BRIEF DESCRIPTION OF THE DRAWINGS

Embodiments of the invention will be described in further detail below with reference to the accompanying drawings, in which:

FIG. 2 are different codeword tables (codebooks) used in an encoding scheme according to an embodiment of the invention, wherein FIG. 2(a) is the codeword table for a 16-dim symbol (16 dimensional symbol=a symbol being comprised of 16 values), wherein FIG. 2(b) is a codeword table for a 8-dim symbol, and wherein FIG. 2(c) is the codeword table for a 4-dim symbol;

FIG. 5 is an example of a level 0 codeword table used for the encoding scheme of FIG. 4;

FIG. 7 is the decoding scheme using the codeword tables of FIG. 2;

FIG. 8 is the decoding scheme for a symbol encoded according to the embodiment of FIG. 6;

DETAILED DESCRIPTION OF THE INVENTION

In the following, embodiments of the invention are described on the basis of figures showing flow diagrams and block diagrams. As far as the figures illustrating block diagrams of an apparatus are concerned it is noted that in these figures also a method is illustrated, wherein the block functionalities correspond to method steps.

Figure 1:
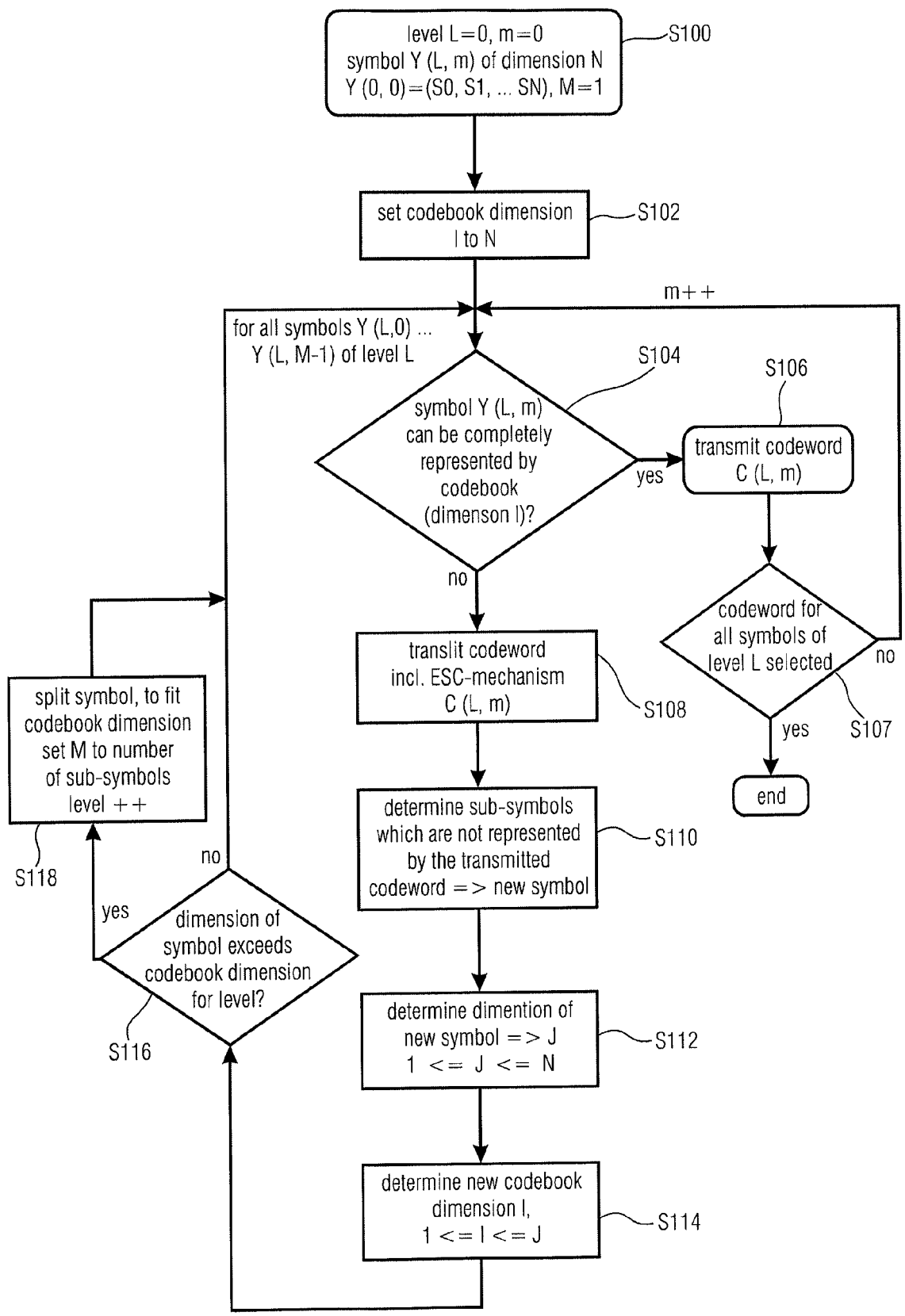
FIG. 1 is a flow diagram representing an encoder scheme in accordance with an embodiment of the invention.

FIG. 1 is a flow diagram representing an encoder scheme operating in accordance to an embodiment of the invention. At a step S100 the encoding approach starts and an encoding level L is set to 0. The symbol $Y(L,m)$ having a dimension N is provided wherein the dimension N indicates that the symbol comprises N values, and m indicates the sub-symbol index at the level L, where m<M with M indicating the number of sub-symbols for the current level. Sub-symbols are obtained by splitting the symbol Y at a level. At step S100 M is set to 1 and correspondingly m is set to 0, so that the symbol provided at the beginning of the process for encoding is the original symbol $Y(0,0)=(S_0, S_1, \ldots, S_N)$.

At Step S102 the codebook dimension I is set to N, i.e. a codebook or codeword table is selected for encoding the n-dimensional symbol Y.

At step S104 it is checked whether the symbol $Y(L,m)$ can be completely represented by the current codebook having the dimension I. In case this is possible, an appropriate codeword $C(L,m)$ is selected from the codebook at step S106 which may be transmitted, e.g. to a decoder, or which may be stored. At step S107 it is determined whether codewords were selected for all symbols $Y(L,m)$ at the current encoding level L. In case codewords for all symbols were selected the encoding process is completed and ends. Otherwise m is increased (m++) by one, i.e. the next symbol (sub-symbol) at level L is selected and the method returns to step S104.

In case the symbol $Y(L,m)$ cannot be represented by a codeword from the codebook the method proceeds to step S108 where a codeword is selected from the codebook that includes at least one escape mechanism. At step S110 it is determined which sub-symbols of the current level are not represented and these sub-symbols determine the "new" symbol. In case "non-encoded" sub-symbols remain this means that the encoder is to use a new codebook of lower dimensionality than the current codebook. At step S112 the dimension J of the new symbol is determined, $1 \leq J \leq N$. At step S114 the new codebook is selected, and the dimension I of the new codebook is selected to be $1 \leq I \leq J$.

At step S114 the dimension of the codebook may be maintained at the previous dimension in case a plurality of sub-symbols of the same dimension are to be encoded using, for example, the same codebook, as to be described in further detail below. In such a case, it is determined at step S116 that the dimension of the symbol does not exceed the codebook dimension for this level and the method returns to step S104.

Alternatively, at step S114 the dimension I of the new codebook may be selected to a value smaller than the dimension J of the new symbol. For example, the dimension of the new codebook may be set to one half of the dimension J of the new symbol. In such a case, it is determined at step S116 that the dimension J of the new symbol exceeds the dimension I of the new codebook so that at step S118 the level is increased by one (level++) and the symbol is split into a plurality of sub-symbols to fit the codebook dimension I selected at step S114. Also, M is increased indicating the number of sub-symbols into which the previous (sub-)symbol was split. The method then returns to step S104 and steps S104 to S118 are repeated for all sub-symbols of the next level L so that by the above-described hierarchical process finally the symbol is encoded by one or more codewords which may then be transmitted.

In the following, an embodiment of the encoding scheme is described in further detail with regard to FIGS. 2 and 3. A hierarchical scheme comprises 16-dim, 8-dim, 4-dim and 1-dim codewords which is optimized for a scenario where a symbol of 16 neighboring "0" has a probability of 0.5. FIG. 2 shows the different codeword tables. FIG. 2(a) shows the codeword table for a 16-dim symbol. The 16-dim codewords are as follows:

| 16-dim codewords | |
|---|---|
| Symbol | Codeword |
| ESC16 | 0 |
| CW16: 16x, 0' | 10 |
| CW16: 15x, 0', 1x, (+/−)1' | 11 VZ XXXX | where
VZ: sign of a value (1 bit)
XXXX: 4 bits to encode the position of the value "1" in the symbol This results in the codeword table shown in FIG. 2(a).

FIG. 2(b) shows the codeword table for an 8-dim symbol, and the 8-dim codewords are as follows:

| 8-dim codewords | |
|---|---|
| Symbol | Codeword |
| ESC8 | 0 |
| CW8: 8x, 0' | 10 |
| CW8: 7x, 0', 1x, (+/−)1' | 11 VZ XXX | where
VZ: sign of a value (1 bit)
XXX: 3 bits to encode the position of the value "1" in the symbol This results in the codeword table shown in FIG. 2(b).

FIG. 2(c) represents the codeword table for the 4-dim symbol. For a 4-dim symbol $S=(S_0, S_1, S_2, S_3)$ the respective codewords S are as follows:
  in case all values for $S_n$, n={0, 1, 2, 3}, are within [−1;1], the symbol $S=(S_0, S_1, S_2, S_3)$ can be represented directly,
  in case some of the values for $S_n$ are not within [−1;1], those values for $S_n$, are not within [−1;1] are represented by escape words (ESC4), and
  in case all values for $S_n$ are not within [−1;1], the symbol $S=(S_0, S_1, S_2, S_3)$ is presented by a single by escape word (ESC4).

For example a symbol S=(−1, 0, 0, −1) will be represented directly by a codeword CW4 from the codeword table in FIG. 2(c), a symbol S=(−2, 3, 4, −5) will be represented only by a codeword CW4=ESC4, and a symbol S=(−1, 3, 0, −5) will be represented by a codeword CW4=(−1, ESC4, 0, ESC4).

The 1-dim symbols which may be eventually obtained are each encoded by respective 1-dimensional or 1-dim codewords which are used to directly encode the 1-dimensional or 1-dim symbol, for example by run-length coding.

On the basis of the above-described codebooks or codeword tables a 16-dim symbol will be encoded. At step S100 (see FIG. 1) L is set to 0, m is set to 0, and N is set to 16 and M is set to 1. The symbol presented at step S100, namely symbol Y(0,0) includes 16 values $S_0 \ldots S_{15}$. The codebook dimension I is set also to 16, i.e. the codeword table shown in FIG. 2(a) is used.

At step S104 it is determined whether a codebook entry is available for the 16-dim symbol. If this is the case, a corresponding codeword is selected at step S106 and, for example, transmitted so that the coding process is finished. In this situation, the coding process is completed.

In case it is determined at step S104 that no codebook entry for the 16-dim symbol is available, the escape word is selected at step S108 and transmitted. Thus, the sub-symbols not yet represented by the transmitted codeword are all 16 sub-symbols, as is determined at step S110 and the dimension of the new symbol remains at 16, i.e. J=16 at step S112. At step S114 a new codebook having a dimension of 8 is selected. Since this dimension of the codebook is smaller than the dimension of the new symbol J at step S116 the method branches to step S118 where the 16-dim symbol is subdivided into two 8-dim symbols or sub-symbols, M is set to the value of 2 indicating that now two sub-symbols exist, and the level L is increased (level++) to level 1.

The steps S104-S118 are then repeated for all sub-symbols of level 1, i.e. for the two sub-symbols into which the original symbol was split at step S118, namely the two 8-dim symbols. At step S104 it is then again checked if both 8-dim symbols can be encoded directly, i.e. if for each of then a corresponding codeword is contained within the codeword table shown in FIG. 2(b). If this is the case, for each of the 8-dim symbols the corresponding codeword is selected and transmitted at step S108. The coding process is then completed. Otherwise, i.e. in case the first and/or the second 8-dim symbols cannot be represented by a codeword from the 8-dim codebook, an appropriate escape word is selected from the codebook and transmitted.

At step S114 a new codebook having the dimension 4 is then selected, and at step S118 the 8-dim symbol(s) not yet encoded is split into two 4-dim symbols and steps S104-S118 are repeated. Then, if applicable, it will be checked if the 4-dim symbols can be encoded directly, i.e. if the corresponding 4-dim codeword is contained within the codeword table shown in FIG. 2(c). If this is the case, the corresponding codeword is selected and transmitted at step S108. Otherwise, an escape word can be transmitted either for the whole 4-dim symbol or for sub-symbols thereof. Corresponding to the other cases, the 4-dim symbol can be escaped as a whole symbol and then subdivided into four 1-dim symbols which are encoded in the next coding step using a coding scheme as it is described by Henke, Robert, "Simulation eines Audiocodierverfahrens für professionelle Anwendungen", Diplomarbeit, Friedrich-Alexander Universität Erlangen-Nürnberg, Erlangen 1992, Brandenburg, Karlheinz, Henke, Robert, "Near-Lossless Coding of High Quality Digital Audio: First Results", ICASSP-93, IEEE International Conference on Acoustics, Speech, and Signal Processing, vol. 1, 27-30 Apr. 1993, pages 193-196, and EP 0 393 526 A. Also escape codes on a sub-symbol base can be sent, for example for the 1$^{st}$ and 4th sub-symbol only, whereas the 2$^{nd}$ and 3$^{rd}$ sub-symbol can be encoded directly with a 4-dim codeword. The coding process is completed as soon as all sub-symbols can be represented by means of escape and terminating sequences.

The above embodiment will now be described in further detail on the basis of an example for encoding the 16-dim symbol Y(0,0)=(0, 0, 0, −1, 0, 0, 0, 0, 4, 0, −1, −5, −4, 4, 7, 5).

Figure 3:
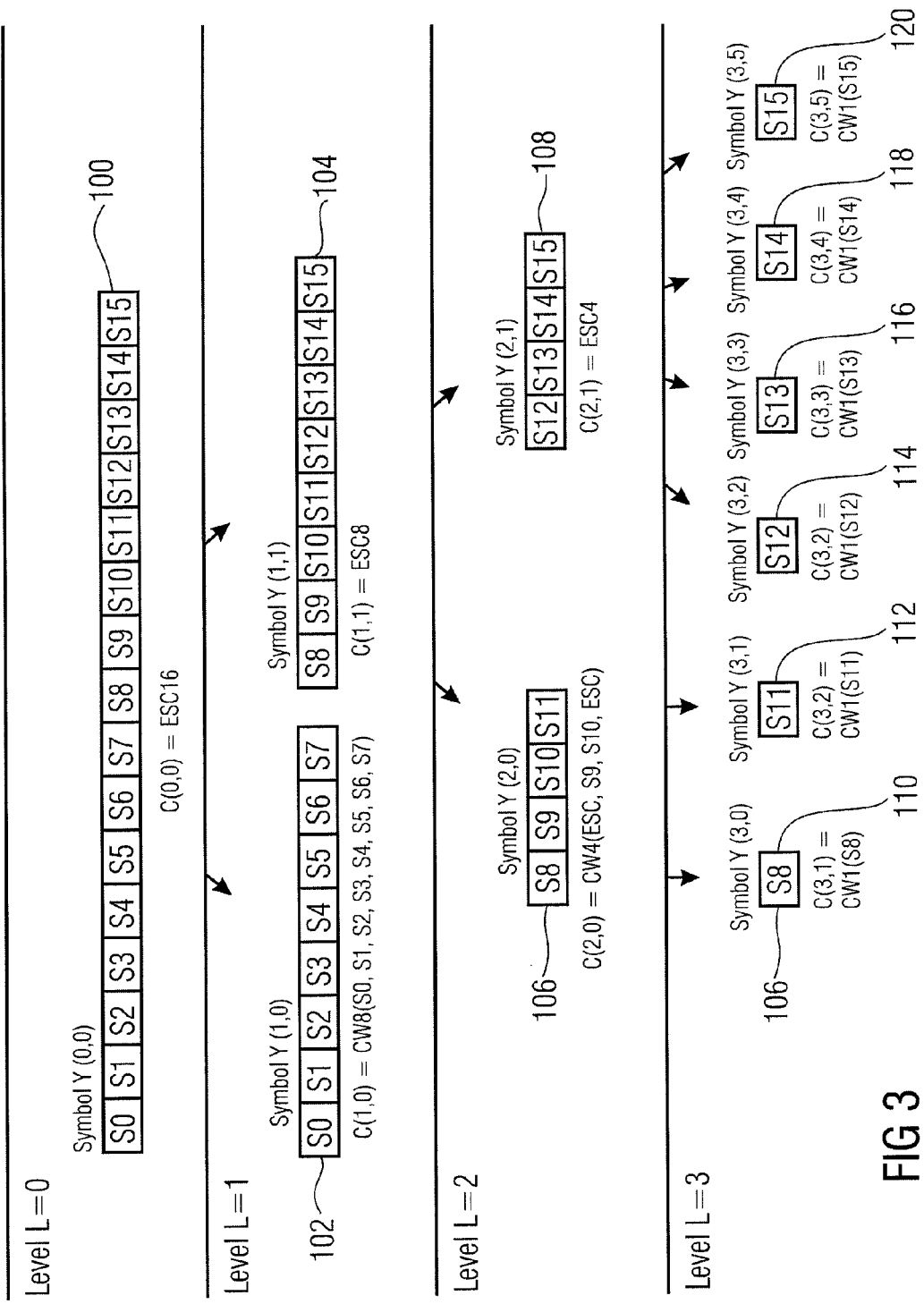
FIG. 3 is the coding scheme using the codeword tables of FIG. 2.

Level 0:

At level 0 the dimensionality I of the codebook is set to 16 and the number of sub-symbols M is set to 1, the index m accordingly to set to 0 so that Y(0,0) has the above form, as it is also schematically in FIG. 3 at 100. At step S104 it is determined whether symbol Y(0,0) can be completely represented by a codeword from the 16-dim codebook as it is shown in FIG. 2(a). As can be seen from FIG. 2(a) there is no corresponding codeword for the symbol Y(0, 0), i.e. the range of available codewords is exceeded. Thus, the codeword C(0, 0) selected is the codeword for the escape sequence ESC16. This codeword is selected and transmitted at step S108. Thus, the remaining symbols which are not represented by the codeword C(0,0) are $S_0$-$S_{15}$.

Level 1:

In accordance with step S112 shown in FIG. 1 it is now determined that the dimension J of the new symbol remains 16. Since in step S108 the codeword for ESC16 was selected it is known that the symbol having the dimension J that corresponds to the current dimension can not be encoded by the current codebook so that at step S114 a new codebook is selected having a dimension I=8. More specifically, the codebook or codeword table as shown in FIG. 2(b) is selected and, since it is determined at step S116 that the dimension J exceeds the dimension I of the new codebook, at step S118 the level is increased to level 1 (level++), the symbol 100 shown in FIG. 3 is split into the first 8-dim symbol Y(1,0) and the second 8-dim symbol Y(1,1) as is shown at 102 and 104 in FIG. 3, and M is set to 2 indicating that two sub-symbols now exist. Thus, the symbol was subdivided to fit the new codebook dimension I:

Y(1,0)=$S_0$ ... $S_7$: (0,0,0,−1,0,0,0,0)

Y(1,1)=S8 ... S15: (4,0,−1,−5,−4,4,7,5)

Steps 104 onward are now repeated for the two symbols 102 and 104. For Y(1,0) it is determined that it can be represented by a codeword from the 8-dim codebook so that the respective codeword C(1,0) is selected and transmitted at step S106 as is indicated in FIG. 3 at level 1. Thus, the codeword CW8 for (0, 0, 0, −1, 0, 0, 0, 0) is selected, namely the codeword "11 1 100".

Since it is determined at step S107 that not for all symbols for the current level a codeword was selected the method returns to step S104 and also for the second 8-dim symbol Y(1,1) it is determined that (4, 0, −1, −5, −4, 4, 7, 5) cannot be represented by an 8-dim codeword from the 8-dim codebook shown in FIG. 2(b). Therefore, the codeword indicating the escape sequence ESC8, namely codeword "0" is selected as shown in FIG. 3 at level 1 and transmitted in accordance with step S108. and the remaining symbols not yet represented by a codeword are symbols $S_8$-$S_{15}$, namely (4, 0, −1, −5, −4, 4, 7, 5).

Level 2:

At step S112 the dimension of the new symbol is set to 8, i.e. corresponds to the number of not yet encoded symbols of the current level. Again, since in step S108 the codeword for ESC8 was selected it is known that the symbol having the dimension J that corresponds to the current dimension can not be encoded by the current codebook so that at step S114 a new codebook is selected having a dimension I=4. Via step S116 and S118 the level is increased to level 2 (level++), the symbol 104 of level 1 not completely represented by a codeword from the 8-dim codebook is split into two 4-dim symbols 106 and 108, namely symbols Y(2,0) and Y(2,1), and M is set to 2 indicating that two sub-symbols for level 2 exist. Thus, the symbol was subdivided to fit the new codebook dimension I:

Y(2,0)=$S_8$ ... $S_{11}$: (4, 0, −1, −5)

Y(2,1)=$S_{12}$ ... $S_{15}$: (−4, 4, 7, 5)

At step S104 it is checked whether symbol Y(2,0) can be completely represented by the 4-dim codebook of FIG. 2(c). The symbol Y(2,0) cannot be completely represented by a single codeword, however, since not all of the values of the symbol Y(2,0) are different from 1,0 or −1 the symbol Y(2,0) is represented by the codeword C(2,0) which corresponds to the codeword in which the symbols "4", "−5" are represented by the escape sequence yielding the codeword CW4=(ESC4, 0, −1, ESC4). This codeword is selected and transmitted at step S108.

At step S110 it is determined that for the current level L=2 sub-symbols remain for which no codeword was selected, namely $S_{12}$ ... $S_{15}$. The dimension J of this new symbol is 4, i.e. corresponds to the current dimension (step 112) so that at step S114 the dimension of the codebook is maintained and the method proceeds via step S116 back to step S104 without splitting the new codeword. Thus, for Y(2,1) it is determined at step S104 whether it can be represented by a codeword from the table of FIG. 2(c). Since the symbols (−4, 4, 7, 5) cannot be represented by the 4-dim codebook and since none of the value of this symbol is −1, 0, or 1, only the escape sequence is transmitted as codeword C(2,1)=ESC4 at step S108.

At step S110 the sub-symbols from level 2 not yet represented by a codeword are determined to be symbols $S_8$, $s_{11}$, $S_{12}$, $S_{13}$, $S_{14}$, and $S_{15}$. At step S114 the next lower dimensional codebook, the 1-dim codebook, is selected. Via steps S116 and S118 the remaining symbols from level 2 are split into single symbols as is indicated at reference signs 110 to 120 in FIG. 3, i.e. the symbol was subdivided to fit the new codebook dimension I:

Y(3,0)=$S_8$: (4)
Y(3,1)=$S_{11}$: (−5)
Y(3,2)=$S_{12}$: (−4)
Y(3,3)=$S_{13}$: (4)
Y(3,4)=$S_{14}$: (7)
Y(3,5)=$S_{15}$: (5)

Each of the symbols Y(3,0) to Y(3,5) is encoded using one of the above-described encoding scheme. Thus, the entire symbol has now been encoded by respective codewords which have been selected during the various levels of encoding and these selected codewords can be combined to represent the symbol in encoded form.

Figure 4:
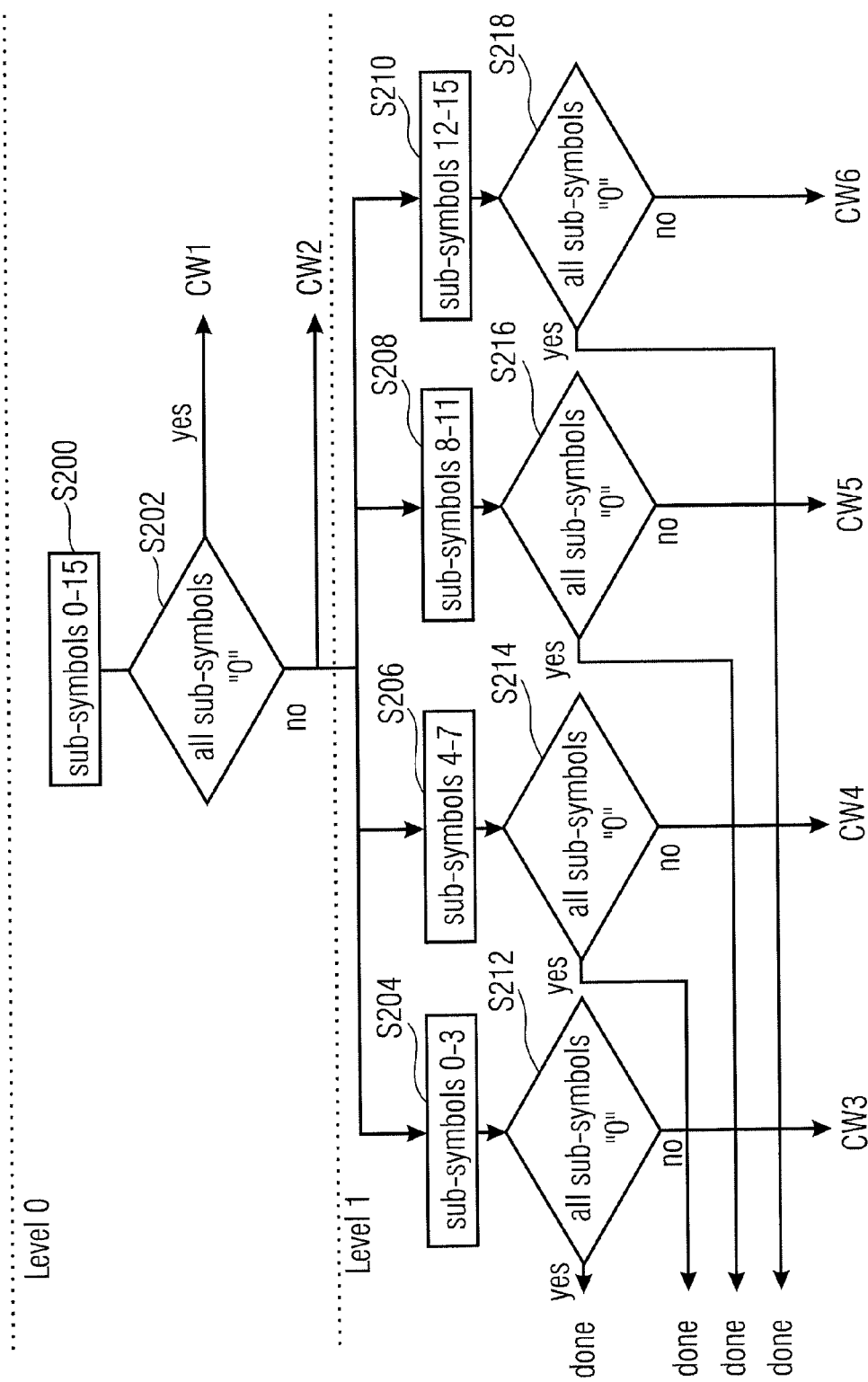
FIG. 4 is a coding scheme in accordance with a further embodiment of the invention.

A further embodiment using the inventive coding scheme will now be described on the basis of FIGS. 4 and 5. Only 16-dim codewords and 4-dim codewords are used, wherein the 16-dim codewords may represent either 16 neighboring "0"s sub-symbols (values) or transmit information, which of the underlying 4-dim symbols consists of "0"'s only or contains symbols unequal to "0". In case sub-symbols unequal to "0" are present in the 16-dim codeword, these symbols are represented by a 4-dim codeword. As is shown in FIG. 4, at level 0 at step S200 the symbol comprising the sub-symbols 0-15 is presented for encoding (see also step S100 of FIG. 1). At step S202 it is checked whether 16 neighboring sub-symbols of the entire symbol can be represented by a 16-dim codeword, i.e. whether these sub-symbols are all "0" (see also step S104 of FIG. 1). If this is the case, a first codeword CW1 will be selected and transmitted, and the encoding procedure is completed (see also steps S106 and S107 of FIG. 1). In case step S202 indicates that not all sub-symbols or values of the symbol provided at step S200 are "0" a second codeword CW2 is output (see also step S108 of FIG. 1). It is determined that some of the symbols remain not encoded (see also step S110 of FIG. 1), the dimension is of the new symbols is set to 4 (see also step S112 of FIG. 1), and the 4-dim codebook is selected (see also step S114 of FIG. 1). Since the codebook dimension and the dimension of the new symbol is not the same, the symbol is split (see also steps S116 and S118 of FIG. 1) into four groups of sub-symbols as indicated at steps S204 to S210, the level is increase to level 1 and M is set to 4.

The codeword CW2 which is selected and transmitted not only indicates, for example by means of an escape mechanism, that additional information has to be transmitted, but also contains information which of the 4-dim symbols shown at steps S204 to S210 consists of "0" sub-symbols/values only and which of the 4-dim symbols at steps S204 to S210 contains sub-symbols not being equal to "0". Codeword CW2 thereby indicates that additional codewords have to be transmitted only for the 4-dim symbols that contain sub-symbols unequal to "0". At steps S212 to S218 it is determined whether the respective sub-symbols shown at steps S204 to S210 include only "0" or not. In case it is determined at step S212 that a sub-symbol only includes "0"s no further action is needed. Otherwise (see step S104 of FIG. 1) one or more of codewords CW3, CW4, CW5, CW6 output (see steps S106 and S107 of FIG. 1).

Thus, in case codeword CW2 signals that there are sub-symbols left which contain values unequal to "0", for each of these 4-dim symbols a codeword CW3, CW4, CW5 and/or CW6 is transmitted as is shown at level 1 in FIG. 4. These words can be terminating codewords or can contain an escape mechanism. Thus, by means of the codewords CW3-CW6, the respective sub-symbols may be decoded. Alternatively, it may be desired to encode the sub-symbols of level 1 in a similar manner as described above with regard to the first embodiment, namely using the 4-dim codeword table and the 1-dim codeword table.

FIG. 5 shows an example of a codeword table that may be used for encoding the symbol at level 0 shown in FIG. 4. A first codeword CW1 having a specific value is used in case all symbol values are "0". Otherwise, codeword CW2 is used indicating that not all symbols are "0" and including additional information which of the four sub-symbols includes "0"'s only which may be represented by providing a "0" for the term $x_n$. Otherwise, in case the sub-symbols include values other than "0" the respective position $x_n$ may be encoded by using a "1".

In the following an example for the coding process in accordance with the above-described second embodiment of the invention will be described on the basis of the symbol of the first embodiment.

Level 0:

The dimensionality of the symbol is 16 and the symbol Y(0,0)=(0, 0, 0, −1, 0, 0, 0, 0, 4, 0, −1, −5, −4, 4, 7, 5) is provided at step S200. At step S204 it is checked whether the symbol Y(0,0) can be represented with a codeword from the codebook shown in FIG. 5. It is determined that no codeword is available and therefore the codeword CW2 is transmitted indicating that not all values of the symbol are "0". In addition, the information which of the sub-symbols 0-3, 4-7, 8-9 and 12-15 includes only "0"'s or includes values different from "0" is included. The first sub-symbols provided at step S204 are symbols (0, 0, 0, −1), the second sub-symbols are (0, 0, 0, 0), the third sub-symbols are (4, 0, −1, −5) and the fourth sub-symbols are (−4, 4, 7, 5). Thus, the codeword CW2 in accordance with FIG. 5 is "11 1011" indicating that the symbol as a whole does not include also values unequal to "0" and that the sub-symbols 4-7 include only "0"'s.

Level 1:

The codeword dimension is now selected to be 4 and those sub-symbols indicated by codeword 2 with a "1" need further encoding. Thus, the first, third and fourth sub-symbols are encoded by the codeword CW3, CW5 and CW6, respectively as the output of step S212 indicates that the sub-symbols provided at step S204 includes symbols being not equal to "0".

Figure 6:
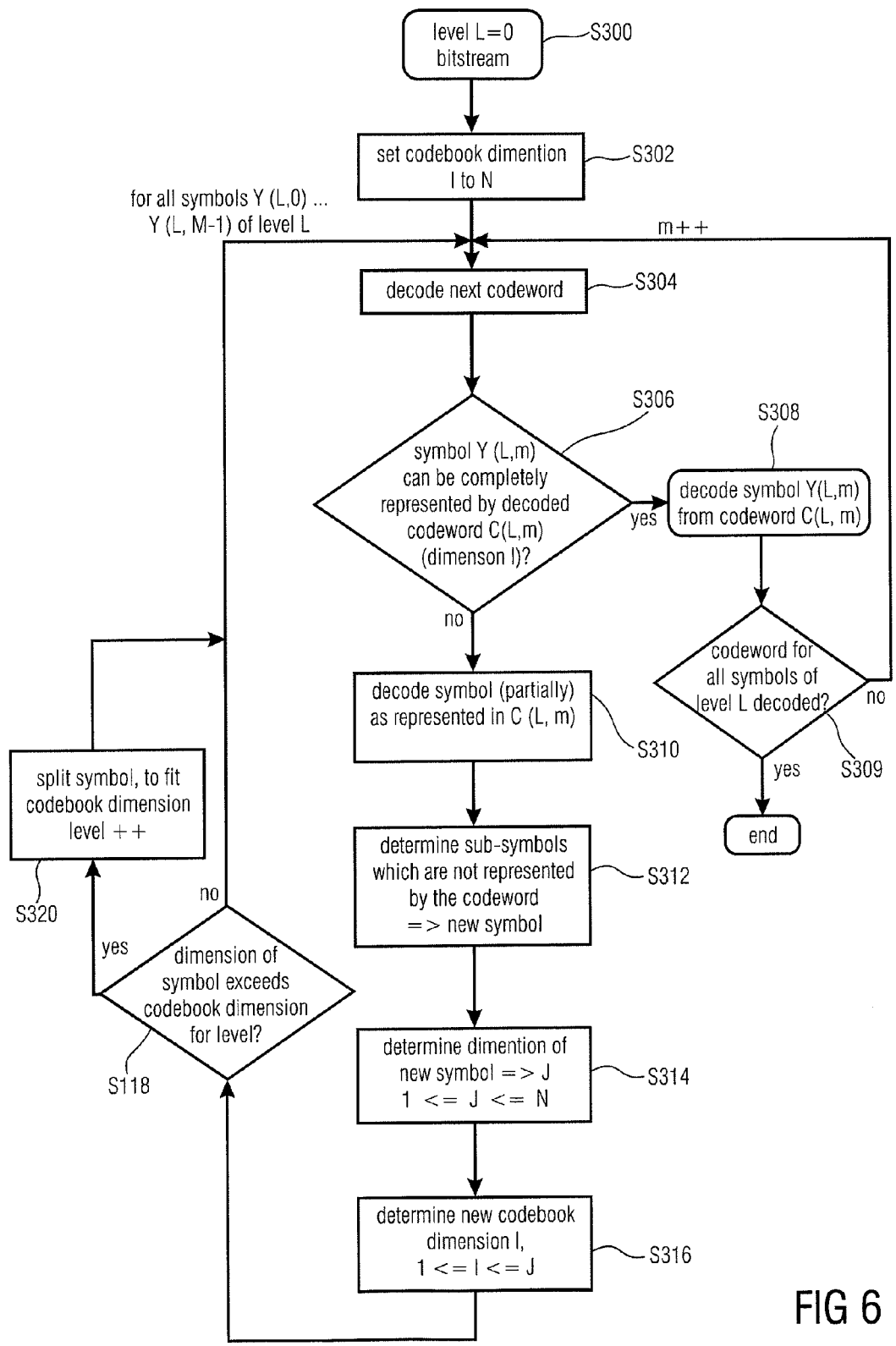
FIG. 6 is a flow diagram representing a decoder scheme in accordance with an embodiment of the invention.

In the following, embodiments of the decoding scheme in accordance with the invention will be described. FIG. 6 is a flow diagram representing an embodiment of the decoding scheme of the invention. At a decoder, a bit stream is received at step S300 and the level for decoding is set to 0. The decoder is aware of the dimension of the symbol which is received in encoded form and sets at step S302 the codebook dimension I to the symbol dimension N. It is assumed that all codewords representing a symbol to be decoded are present or are received at the decoder. At step S304 the next codeword is decoded and it is determined at step S306 whether a symbol is completely represented by the decoded codeword C(L,m) and in case it does, at step S308 an entry is selected from the present codebook using the codeword thereby yielding the symbol. At step S309 it is determined whether all codeword for the current level were decoded (what means that the entire symbol was decoded). If this is true, the decoding process will be completed. Otherwise, the method returns to step S304 for decoding the next codeword of the current level.

In case the entry associated with the codeword in the codebook indicates that same does not represent the entire symbol the method proceeds to step S310. At step S310 the symbol is decoded in accordance with the entry associated with the codeword C(L,m) (e.g. an escape sequence is decoded which indicates that additional codewords will follow), and at step S312 it is determined how many sub-symbols of the current level were not yet represented by a codeword. The dimension of the new symbol is set between 1 and N at step S314. At step S316, a new codebook dimension I is selected, if needed, and the new dimension is between 1 and the dimension of the new symbol. Thus, in case a plurality of sub-symbols of a specific dimension need to be decoded, the codebook remains the same dimension at step S316 so that at step S318 it is determined that the symbol does not exceed the codebook dimension so that for the remaining sub-symbols of the same level decoding can be executed. Otherwise, in case a new codebook with a smaller dimension is selected it is determined at step S318 that the remaining symbols exceed the codebook dimension so that at step S320 the level and M is increased, and it is determined that the original symbol was split into a plurality of sub-symbols for which the next codewords would then be received and decoded by repeating steps S304-S316.

The above decoding scheme will now be described on the basis of an example, more specifically on the basis of the example given using the codeword tables of FIG. 2. In FIG. 7, it is assumed that a decoder comprises a decoder register 130 which is provided for receiving respective sub-symbols or values of the original symbol which was encoded in accordance with the above embodiments.

Level 0:

At the decoder, at step S300 the level L is set to 0 and the decoder knows that the dimensionality N of the symbol to be decoded is 16 so that the dimensionality of the codebook I is set at step S302 to be 16 as well. At step S304 the codeword C(0,0) is received which indicates an escape mechanism ESC16 indicating that the symbol Y(0,0) cannot be represented by a codeword from the 16-dim codebook of FIG. 2(a). Therefore, all positions for $S_0$-$S_{15}$ in the register 130 remain empty as no decoded value is yet available. Thus, the remaining symbols to be decoded are all 16 symbols $S_0$-$S_{15}$. The dimension of the codebook is switched to 8 at step S314. Since the remaining symbols to be decoded and the dimension of the next codebook are different, at step S320 the level is increased to level 1 and it is determined that for the next level two codewords are received.

Level 1:

At step S304 codeword C(1,0) is received and at step S306 it is determined that this codeword completely represents the first of the 8-dim sub-symbols for level 1 so that the entry associated with CW8 is selected from the table, thereby populating the register positions for $S_0$-$S_7$ with the respective values, in the above example with the values (0, 0, 0, −1, 0, 0, 0, 0) as is indicated by the hatched fields in FIG. 7 at level 1. It is then determined at step S309 that not all codewords for level 1 were yet decoded so that the method returns to step S304 for decoding the next codeword C(1,1) of level 1. Codeword C(1,1) indicates an escape mechanism, namely ESC8 as shown in FIG. 7. Thus, it is determined at step S308 that the symbol cannot be decoded and that the remaining symbols are symbols $S_8$-$S_{15}$, so that the corresponding register positions in register 130 remain empty as is indicated by the non-hatched positions shown in FIG. 7 at level 1.

At step S312 it is determined that 8 sub-symbols of level 1 cannot be represented and at step S316 the 4-dim codebook is selected the dimension of which is smaller than the number of remaining symbols so that at step S318 the method proceeds to step S320 where the level is increased.

Level 2:

At step S304 the next codeword C(2,0), the first codeword for level 2 is received which can be partially decoded as symbols $S_9$, $S_{10}$ are directly represented and for symbols $S_8$ and $S_{11}$ escape codes are transmitted so that at step S310 register positions $S_9$ and $S_{10}$ are populated whereas register positions $S_8$ and $S_{11}$ remain empty. The 8-dim symbol of level 1 was only partially decoded and the remaining symbols are symbols $S_8$ and $S_{11}$. However, the codeword dimension is maintained at step S316 so that at step S304 the next codeword C(2,1) is received and decoded and indicates that none of the symbols $S_{12}$-$S_{15}$ is represented as only the escape mechanism is transmitted. Therefore, at step S312 it is determined that symbols $S_{12}$-$S_{15}$ remain.

Level 3:

Since no further codewords for the second level exist the dimension of the codebook is switched to one and all those symbols not yet decoded are decoded in level 3 by means of the respective codewords received and decoded at step S304 which directly represent the respective symbols thereby populating the entire decoder register 130 shown in FIG. 7 and thereby yielding the entire decoded symbol.

Decoded codeword C(3,0) represents $S_8$ completely (in combination with info transmitted for $S_8$ in level 2)

Decoded codeword C(3,1) represents $S_{11}$ completely (in combination with info transmitted for $S_{11}$ in level 2)

Decoded codeword C(3,2) represents S12 completely

Decoded codeword C(3,3) represents S13 completely

Decoded codeword C(3,4) represents S14 completely

Decoded codeword C(3,5) represents S15 completely

With regard to the level 3 decoding it is noted that the basic difference between the codewords C(3,0), C(3,1) and the codewords C(3,2)-C(3,5) is that the first mentioned codewords base the symbol reconstruction on the codeword from the second level C(2,0), whereas the latter mentioned codewords do not. In the above example codeword C(2,0) signals that symbols $S_8$ and $S_{11}$ exceed +/−1. In codeword C(2,1) it is signaled that none of the symbols $S_{12}$-$S_{15}$ is resolved, i.e. all needed information will be transmitted via the codewords C(3,2)-C(3,5).

In the above-described encoder/decoder approach the codebook dimension for a certain number of remaining symbols which is selected at step S316 is fixed and synchronous both at the encoder and at the decoder. For example, in the above example in case at level 0 the number of remaining, i.e. non-decoded symbols is 16, the codebook dimension is switched to 8. In a similar manner when the number of remaining, non-decoded symbols is 8, the dimension is switched to 4. Further, the order in which the codewords are provided by the encoder and by which they are decoded is fixed at the encoder/decoder, i.e. either all codewords per level are encoded/decoded or all levels per codeword.

FIG. 8 illustrates the decoding scheme in accordance with the invention on the basis decoding a symbol which was encoded in accordance with the embodiment of FIG. 4. At step S300 the level is set to 0 and the dimension of the codebook is set to 16, i.e. the codebook of FIG. 5 is selected. At step S304 the first codeword C(0,0) is received which is the codeword CW2(111011). This indicates that not all symbols of the 16-dim symbol are "0", however the second sub-symbol group, namely sub-symbols 4-7 are 0 whereas all other sub-symbol groups include values not being 0. Thus, at step S306 it is determined that the symbol Y(0,0) cannot be completely decoded, however, at step S310 it is determined that the symbol can be partially decoded so that at decoder register positions $S_4$-$S_7$ "0"'s are introduced as is indicated in FIG. 8 by the hatched portions of register 130.

The remaining sub-symbols, namely the symbols $S_0$-$S_3$ and $S_8$-$S_{15}$ are determined and the codebook is switched at S316 to a 4-dim codebook and the next three codewords received are decoded and represent the respective symbols $S_0$-$S_3$, $S_8$-$S_{11}$ and $S_{12}$-$S_{15}$ by means of the codewords CW3, CW5 and CW6 thereby populating the remaining decoder register positions as shown in FIG. 8 at level 1. Decoding at level 1 is done using the additional information from the codeword C(0,0) of level 0 from which it is known for which sub-symbol groups the codewords received for level 1 are used.

Figure 9:
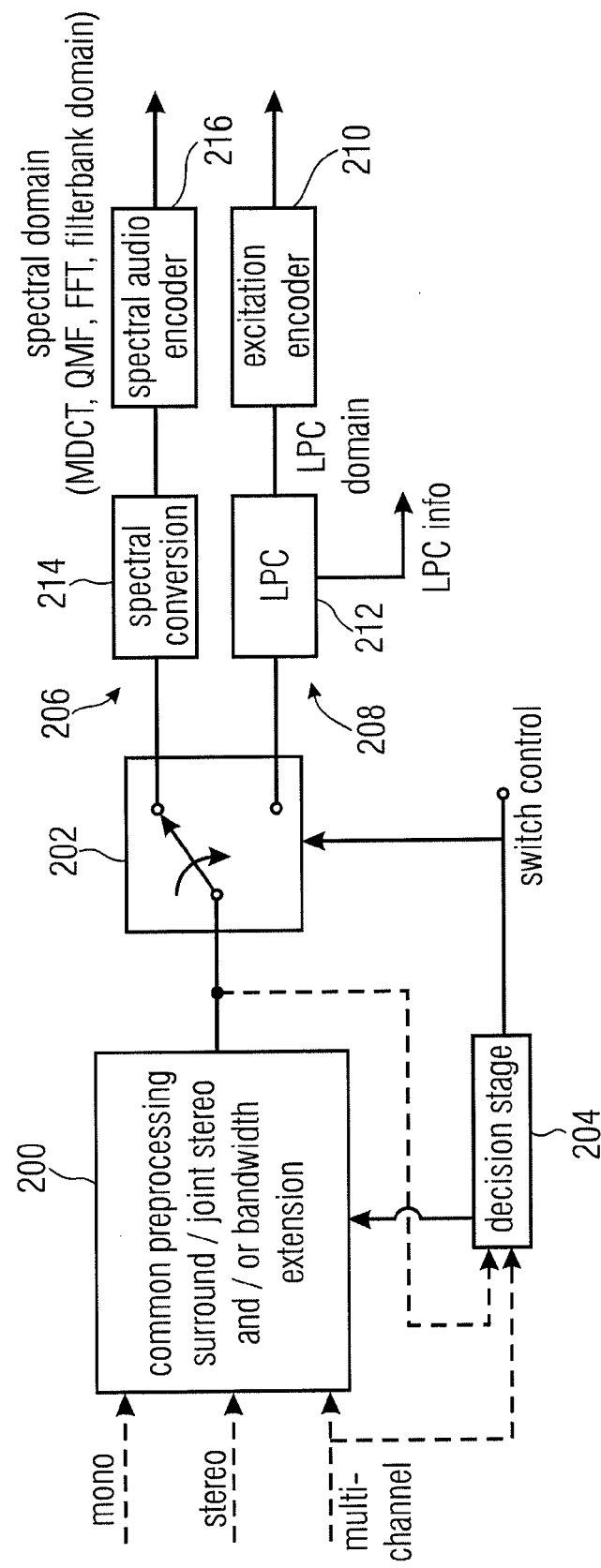
FIG. 9 is a block diagram of an exemplary encoder using the encoding scheme in accordance with the embodiments of the invention.
Figure 10:
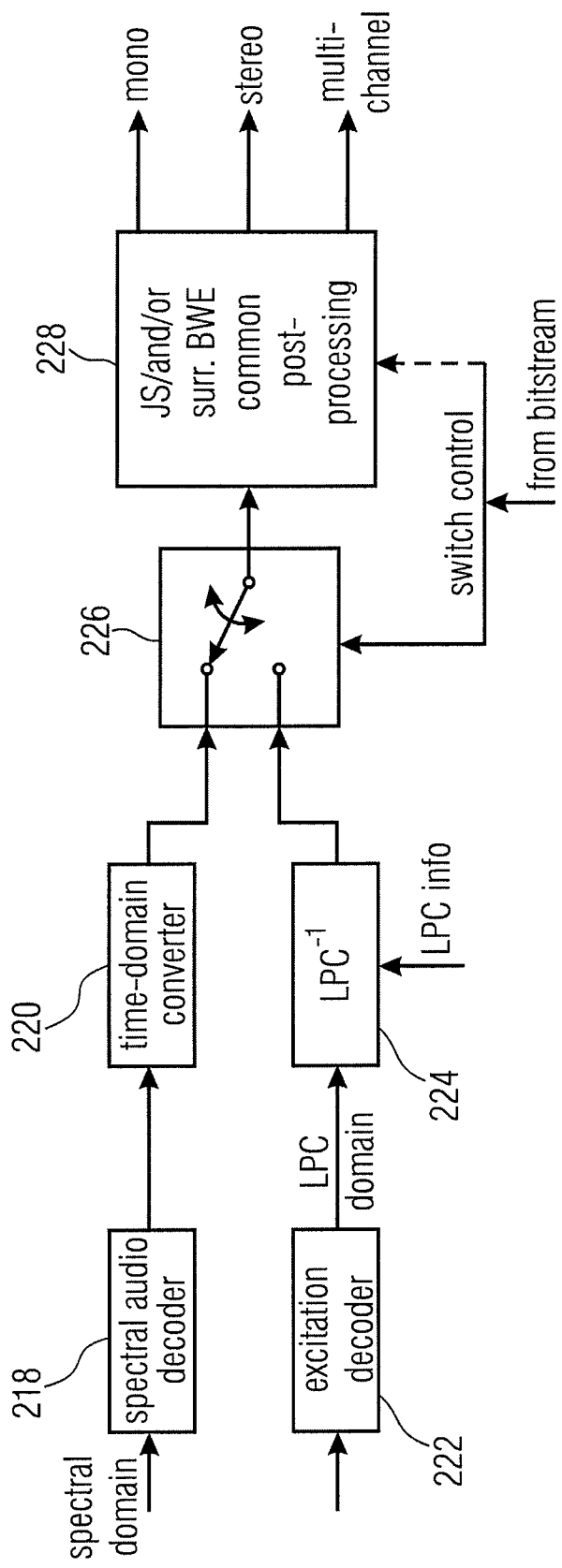
FIG. 10 is a block diagram of an exemplary decoder using the decoding scheme in accordance with embodiments of the invention.

In the following, reference is made to FIGS. 9 and 10 illustrating exemplary encoder and decoder operating in accordance with the encoder and decoder schemes of embodiments of the invention.

In accordance with the exemplary encoder shown in FIG. 9 a mono signal, a stereo signal or a multi-channel signal is input into a common preprocessing stage 200. The common preprocessing stage 200 may have a joint stereo functionality, a surround functionality, and/or a bandwidth extension functionality. At the output of stage 200 there is a mono channel, a stereo channel or multiple channels which is input into one or more switches 202. The switch 202 may be provided for each output of stage 200, when stage 200 has two or more outputs, i.e., when stage 200 outputs a stereo signal or a multi-channel signal. Exemplarily, the first channel of a stereo signal may be a speech channel and the second channel of the stereo signal may be a music channel. In this case, the decision in a decision stage 204 may be different between the two channels at the same time instant. The switch 202 is controlled by the decision stage 204. The decision stage comprises a discriminator and receives, as an input, a signal input into stage 200 or a signal output by stage 200. Alternatively, the decision stage 204 may also receive a side information which is included in the mono signal, the stereo signal or the multi-channel signal or is at least associated with such a signal, where information is existing, which was, for example, generated when originally producing the mono signal, the stereo signal or the multi-channel signal.

In one embodiment, the decision stage does not control the preprocessing stage 200, and the arrow between stage 204 and 200 does not exist. In a further embodiment, the processing in stage 200 is controlled to a certain degree by the decision stage 204 in order to set one or more parameters in stage 200 based on the decision. This will, however not influence the general algorithm in stage 200 so that the main functionality in stage 200 is active irrespective of the decision in stage 204.

The decision stage 204 actuates the switch 202 in order to feed the output of the common preprocessing stage either in a frequency encoding portion 204 illustrated at an upper branch of FIG. 9 or an LPC-domain encoding portion 206 illustrated at a lower branch in FIG. 9.

In one embodiment, the switch 202 switches between the two coding branches 206, 208. In a further embodiment, there may be additional encoding branches such as a third encoding branch or even a fourth encoding branch or even more encoding branches. In an embodiment with three encoding branches, the third encoding branch may be similar to the second encoding branch, but includes an excitation encoder different from the excitation encoder 210 in the second branch 208. In such an embodiment, the second branch comprises the LPC stage 212 and a codebook based excitation encoder 210 such as in ACELP, and the third branch comprises an LPC stage and an excitation encoder operating on a spectral representation of the LPC stage output signal.

The frequency domain encoding branch comprises a spectral conversion block 214 which is operative to convert the common preprocessing stage output signal into a spectral domain. The spectral conversion block may include an MDCT algorithm, a QMF, an FFT algorithm, Wavelet analysis or a filterbank such as a critically sampled filterbank having a certain number of filterbank channels, where the subband signals in this filterbank may be real valued signals or complex valued signals. The output of the spectral conversion block 214 is encoded using a spectral audio encoder 216, which may operate in accordance with the encoding scheme of embodiments of the invention.

The lower encoding branch 208 comprises a source model analyzer such as LPC 212, which outputs two kinds of signals. One signal is an LPC information signal which is used for controlling the filter characteristic of an LPC synthesis filter. This LPC information is transmitted to a decoder. The other LPC stage 212 output signal is an excitation signal or an LPC-domain signal, which is input into an excitation encoder 210. The excitation encoder 210 may operate in accordance with the encoding scheme of embodiments of the invention.

The decision in the decision stage 204 may be signal-adaptive so that the decision stage 204 performs a music/speech discrimination and controls the switch 202 in such a way that music signals are input into the upper branch 206, and speech signals are input into the lower branch 208. In one embodiment, the decision stage 202 feeds its decision information into an output bit stream, so that a decoder may use this decision information in order to perform the correct decoding operations.

Such a decoder is illustrated in FIG. 10. After transmission, the signal output by the spectral audio encoder 216 is input into a spectral audio decoder 218. The output of the spectral audio decoder 218 is input into a time-domain converter 220. The output of the excitation encoder 210 of FIG. 9 is input into an excitation decoder 222 which outputs an LPC-domain signal. The decoders 218 and 222 may operate in accordance with the decoding scheme of embodiments of the invention. The LPC-domain signal is input into an LPC synthesis stage 224, which receives, as a further input, the LPC information generated by the corresponding LPC analysis stage 212. The output of the time-domain converter 220 and/or the output of the LPC synthesis stage 224 are input into a switch 226. The switch 226 is controlled via a switch control signal which was, for example, generated by the decision stage 202, or which was externally provided such as by a creator of the original mono signal, stereo signal or multi-channel signal.

The output of the switch 226 is a complete mono signal which is subsequently input into a common post-processing stage 228, which may perform a joint stereo processing or a bandwidth extension processing etc. Alternatively, the output of the switch may also be a stereo signal or a multi-channel signal. It is a stereo signal, when the preprocessing includes a channel reduction to two channels. It may even be a multi-channel signal, when a channel reduction to three channels or no channel reduction at all but only a spectral band replication is performed.

Depending on the specific functionality of the common post-processing stage, a mono signal, a stereo signal or a multi-channel signal is output which has, when the common post-processing stage 228 performs a bandwidth extension operation, a larger bandwidth than the signal input into block 228.

In one embodiment, the switch 226 switches between the two decoding branches 218, 220 and 222, 224. In a further embodiment, there may be additional decoding branches such as a third decoding branch or even a fourth decoding branch or even more decoding branches. In an embodiment with three decoding branches, the third decoding branch may be similar to the second decoding branch, but includes an excitation decoder different from the excitation decoder 222 in the second branch 222, 224. In such an embodiment, the second branch comprises the LPC stage 224 and a codebook based excitation decoder such as in ACELP, and the third branch comprises an LPC stage and an excitation decoder operating on a spectral representation of the LPC stage 224 output signal.

In another embodiment, the common preprocessing stage comprises a surround/joint stereo block which generates, as an output, joint stereo parameters and a mono output signal, which is generated by downmixing the input signal which is a signal having two or more channels. Generally, the signal at the output of block 200 may also be a signal having more channels, but due to the downmixing operation, the number of channels at the output of block 200 will be smaller than the number of channels input into block 200. In this embodiment, the frequency encoding branch comprises a spectral conversion stage and a subsequently connected quantizing/coding stage. The quantizing/coding stage may include any of the functionalities as known from modern frequency-domain encoders such as the AAC encoder. Furthermore, the quantization operation in the quantizing/coding stage may be controlled via a psychoacoustic module which generates psychoacoustic information such as a psychoacoustic masking threshold over the frequency, where this information is input into the stage. Advantageously, the spectral conversion is done using an MDCT operation which, even more advantageous, is the time-warped MDCT operation, where the strength or, generally, the warping strength may be controlled between zero and a high warping strength. In a zero warping strength, the MDCT operation is a straight-forward MDCT operation known in the art. The LPC-domain encoder may include an ACELP core calculating a pitch gain, a pitch lag and/or codebook information such as a codebook index and a code gain.

The present invention is not limited to the above scenario. Rather, the inventive approach may also be used in conventional MP3 or AAC encoders and decoders.

Figure 11:
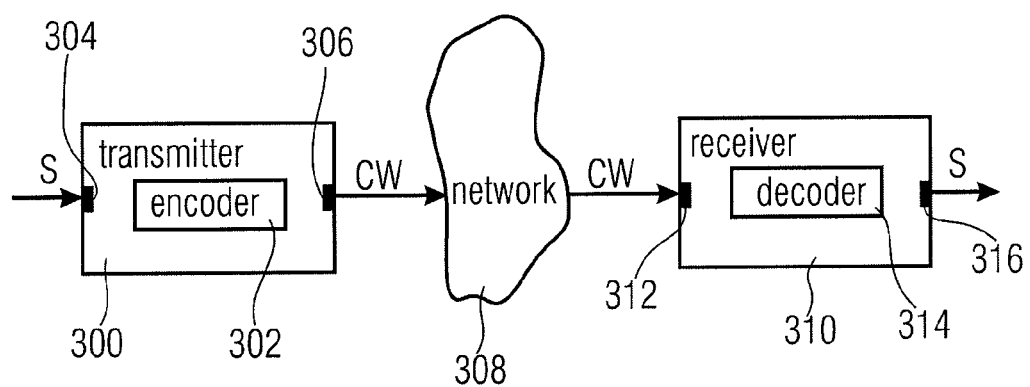
FIG. 11 is a system for transmitting a symbol from a transmitter to a receiver.

FIG. 11 illustrates a system for transmitting a symbol from a transmitter to a receiver. The system shown in FIG. 11 comprises a transmitter 300 including an encoder 302, for example an encoder as it is shown in FIG. 9. In general, the encoder 302 operates in accordance with the embodiments described above, i.e. an input signal received at the input 304 of the transmitter 300 includes a symbol S which is encoded by the encoder 302 in accordance with the embodiments described above to provide at an output 306 of the transmitter an output signal including one or more codewords CW. The system comprises a communication link, for example a network 308 via which the signal including the codewords CW is transmitted to a receiver 310. The receiver 310 comprises an input 312 for receiving an input signal including the plurality of codewords which are provided to a decoder 314. The decoder 314 may, for example, be a decoder as shown in FIG. 10 or any other kind of decoder which operates in accordance with embodiments of the invention. As described above, the decoder 314 is operative to generate on the basis of the received codewords CW the symbol S, which is output in an output signal via an output 316 of the receiver 310. The decoded symbol may be used for further processing, like generating audio signal, a video signal or kinds of signals.

In the above embodiments specific codebook configurations were described, however, the invention is not limited to such embodiments. Rather, different codebook configurations may be used.

In a further embodiment, such a configuration may comprise codewords having a lower dimension, whereas the range of values represented by the codewords of the second codebook is larger than the range of values represented by the first codebook.

In another embodiment the subsequent codebook may comprise codewords having lower dimensionality, wherein the range of values represented by the codewords of the second codebook and the first codebook is the same.

In yet another embodiment the second codebook may comprise codewords having the same dimensionality as the codewords of the first codebook, wherein the range of values represented by the second codebook is larger than the range of values represented by the first codebook.

The above embodiments were described in the context of a coding/decoding scheme for coding/decoding quantized spectral values. However, the present invention is not limited to such an environment, rather any kind of information signal may be encoded/decoded in accordance with the principles of the present invention.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed. Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier. Other embodiments comprise the computer program for performing one of the methods described herein, stored on a machine readable carrier. Thus, an embodiment of the inventive method is, therefore, a computer program having a program code for performing one of the methods described herein, when the computer program runs on a computer. A further embodiment of the inventive methods is, therefore, a data carrier (or a digital storage medium, or a computer-readable medium) comprising, recorded thereon, the computer program for performing one of the methods described herein. A further embodiment of the inventive method is, therefore, a data stream or a sequence of signals representing the computer program for performing one of the methods described herein. The data stream or the sequence of signals may for example be configured to be transferred via a data communication connection, for example via the Internet. A further embodiment comprises a processing means, for example a computer, or a programmable logic device, configured to or adapted to perform one of the methods described herein. A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for encoding an original symbol comprising a plurality of values, the method comprising:
    (a) determining whether the symbol can be encoded by a codeword of a first codebook;
    (b) in case the symbol can be encoded by a codeword of the first codebook, selecting the codeword associated with the symbol from the first codebook; and
    (c) in case the symbol cannot be encoded by a codeword of the first codebook:
        (c.1) selecting a codeword from the first codebook indicating that the symbol cannot be encoded by a codeword of the first codebook,
        (c.2) splitting the symbol into a plurality of first sub-symbols, each of the first sub-symbols comprising a predefined number of values of the original symbol, and selecting a codeword for each of the first sub-symbols from a second codebook,
    wherein the encoded symbol is represented only by the codeword selected in step (b) from the first codebook, or by the codeword selected in step (c.1) from the first codebook and the plurality of codewords selected in step (c.2) from the second codebook.

2. The method of claim 1, further comprising in case for one or more of the first sub-symbols a codeword was selected from the second codebook indicating that the respective first sub-symbol cannot be encoded by a codeword of the second codebook:
    (d) for each first sub-symbol that cannot be encoded by a codeword from the second codebook:
        splitting the first sub-symbol into a plurality of second sub-symbols, each of the second sub-symbols comprising a predefined number of values of the first sub-symbol, and
        selecting a codeword for each of the second sub-symbols from a third codebook.

3. The method of claim 2, wherein
    the second or third codebooks comprises a first codeword indicating that a sub-symbol cannot be encoded by a codeword of the second or third codebooks;
    the sub-symbol is represented by a second codeword from the second or third codebooks in case each value of the sub-symbol is within a predefined range of values,
    the sub-symbol is represented by a combination of one or more values of the sub-symbol and the first codeword, wherein those values of the sub-symbol which are not in the predefined range are represented by the first codeword, and
    the sub-symbol is represented by the first codeword only in case none of the values of the sub-symbols is within the predefined range.

4. The method of claim 3, further comprising:
    in case the sub-symbol or one or more values of the sub-symbol are represented by the specific codeword, selecting for each value of the sub-symbol represented by the specific codeword a codeword from a further codebook.

5. The method of one claim 2, wherein at step (d) a codeword is selected from the second codebook indicating that a first sub-symbol cannot be encoded by a codeword of the second codebook, and a codeword is selected from the third codebook for each of the second sub-symbols.

6. The method of claim 1, wherein
    at step (c) the codeword selected from the first codebook further indicates which of the first sub-symbols comprises a predefined combination of values, and
    at step (c) for those first sub-symbols not comprising the predefined combination of values a codeword is selected from the second codebook.

7. A method for decoding an original symbol comprising a plurality of values and being encoded by one or more codewords, the method comprising:
    (a) determining whether a first codeword can completely represent the symbol using a first codebook;
    (b) in case the first codeword can completely represent the symbol using the first codebook, selecting the symbol from the first codebook using the first codeword; and
    (c) in case the first codeword cannot completely represent the symbol using the first codebook,
        selecting a second codebook for decoding first sub-symbols of the symbol, wherein each of the first sub-symbols comprises a predefined number of values the original symbol, and
        selecting an entry for each of the first sub-symbols from the second codebook using a second codeword,
    wherein the symbol is represented by the values associated only with the codeword from the first codebook, or associated with a combination of the codeword selected from the first codebook and the plurality of codewords selected from the second codebook.

8. The method of claim 7, further comprising:
    (d) in case the second codebook cannot completely represent one of the first sub-symbols:
        selecting a third codebook for decoding second sub-symbols of the one first sub-symbol, wherein each of the second sub-symbols comprises a predefined number of values of the first sub-symbol, and
        selecting an entry for each of the second sub-symbols from the third codebook using a third codeword.

9. The method of claim 8, wherein
    at step (c) the first codebook indicates for the first codeword that the symbol cannot be decoded from the first codebook, and for each of the first sub-symbols an entry is selected from the second codebook, and
    at step (d) the second codebook indicates for a second codeword of a first sub-symbol that the first sub-symbol cannot be decoded by the second codebook, and for each of the second sub-symbols an entry is selected from the third codebook.

10. The method of claim 7, wherein
    at step (c) the first codebook indicates for the first codeword that the symbol cannot be decoded from the first codebook and which of the first sub-symbols comprises a predefined combination of values, and
    at step (c) for those sub-symbols not comprising the predefined combination of values an entry is selected from the second codebook.

11. The method of claim 1, wherein the second codebook comprises codewords having the same dimensionality as the codewords in the first codebook, wherein the range of values represented by the codewords of the second codebook is larger than the range of values represented by the first codebook, or
    wherein the second codebook comprises codewords being of lower dimensionality than the codewords of the first codebook, wherein the range of values represented by the codewords of the second codebook and the first codebook is the same, or
    wherein the second codebook comprises codewords being of lower dimensionality than the codewords of the first codebook, wherein the range of values represented by the second codebook is larger than the range of values represented by the first codebook.

12. A method for transmitting a symbol from a transmitter to a receiver, the method comprising:
  encoding, in the transmitter, the symbol, wherein encoding the symbol comprises:
    (a) determining whether the symbol can be encoded by a codeword of a first codebook;
    (b) in case the symbol can be encoded by a codeword of the first codebook, selecting the codeword associated with the symbol from the first codebook; and
    (c) in case the symbol cannot be encoded by a codeword of the first codebook:
      (c.1) selecting a codeword from the first codebook indicating that the symbol cannot be encoded by a codeword of the first codebook,
      (c.2) splitting the symbol into a plurality of first sub-symbols, each of the first sub-symbols comprising a predefined number of values of the original symbol, and selecting a codeword for each of the first sub-symbols from a second codebook,
    wherein the encoded symbol is represented only by the codeword selected in step (b) from the first codebook, or by the codeword selected in step (c.1) from the first codebook and the plurality of codewords selected in step (c.2) from the second codebook;
  transmitting the selected codewords from the transmitter to the receiver,
  decoding, in the receiver, the received codewords to obtain the symbol, wherein decoding the received codewords comprises:
    (a) determining whether a first codeword can completely represent the symbol using a first codebook;
    (b) in case the first codeword can completely represent the symbol using the first codebook, selecting the symbol from the first codebook using the first codeword; and
    (c) in case the first codeword cannot completely represent the symbol using the first codebook,
      selecting a second codebook for decoding first sub-symbols of the symbol, wherein each of the first sub-symbols comprises a predefined number of values the original symbol, and
      selecting an entry for each of the first sub-symbols from the second codebook using a second codeword,
    wherein the symbol is represented by the values associated only with the codeword from the first codebook, or associated with a combination of the codeword selected from the first codebook and the plurality of codewords selected from the second codebook, and
  providing the symbol for further processing.

13. A non-transitory computer-readable medium having stored thereon a computer program having computer executable instructions for performing a method for transmitting a symbol from a transmitter to a receiver, the method comprising:
  encoding, in the transmitter, the symbol, wherein encoding the symbol comprises:
    (a) determining whether the symbol can be encoded by a codeword of a first codebook;
    (b) in case the symbol can be encoded by a codeword of the first codebook, selecting the codeword associated with the symbol from the first codebook; and
    (c) in case the symbol cannot be encoded by a codeword of the first codebook:
      (c.1) selecting a codeword from the first codebook indicating that the symbol cannot be encoded by a codeword of the first codebook,
      (c.2) splitting the symbol into a plurality of first sub-symbols, each of the first sub-symbols comprising a predefined number of values of the original symbol, and selecting a codeword for each of the first sub-symbols from a second codebook,
    wherein the encoded symbol is represented only by the codeword selected in step (b) from the first codebook, or by the codeword selected in step (c.1) from the first codebook and the plurality of codewords selected in step (c.2) from the second codebook;
  transmitting the selected codewords from the transmitter to the receiver,
  decoding, in the receiver, the received codewords to obtain the symbol, wherein decoding the received codewords comprises:
    (a) determining whether a first codeword can completely represent the symbol using a first codebook;
    (b) in case the first codeword can completely represent the symbol using the first codebook, selecting the symbol from the first codebook using the first codeword; and
    (c) in case the first codeword cannot completely represent the symbol using the first codebook,
      selecting a second codebook for decoding first sub-symbols of the symbol, wherein each of the first sub-symbols comprises a predefined number of values the original symbol, and
      selecting an entry for each of the first sub-symbols from the second codebook using a second codeword,
    wherein the symbol is represented by the values associated only with the codeword from the first codebook, or associated with a combination of the codeword selected from the first codebook and the plurality of codewords selected from the second codebook, and
  providing the symbol for further processing.

14. An encoder, comprising:
  an input for receiving an input signal comprising a symbol;
  an encoder circuit for encoding the symbol from the input signal, wherein the encoder circuit is configured to encode the symbol, wherein encoding the symbol comprises:
    (a) determining whether the symbol can be encoded by a codeword of a first codebook;
    (b) in case the symbol can be encoded by a codeword of the first codebook, selecting the codeword associated with the symbol from the first codebook; and
    (c) in case the symbol cannot be encoded by a codeword of the first codebook:
      (c.1) selecting a codeword from the first codebook indicating that the symbol cannot be encoded by a codeword of the first codebook,
      (c.2) splitting the symbol into a plurality of first sub-symbols, each of the first sub-symbols comprising a predefined number of values of the original symbol, and selecting a codeword for each of the first sub-symbols from a second codebook,
    wherein the encoded symbol is represented only by the codeword selected in step (b) from the first codebook, or by the codeword selected in step (c.1) from the first codebook and the plurality of codewords selected in step (c.2) from the second codebook; and
  an output for providing an output signal comprising the selected codewords representing the symbol.

15. A decoder, comprising:
  an input for receiving an input signal comprising a plurality of codewords representing a symbol;

a decoder circuit for decoding the codewords from the input signal, wherein the decoder circuit is configured to decode the codewords, wherein encoding the symbol comprises:
  (a) determining whether the symbol can be encoded by a codeword of a first codebook;
  (b) in case the symbol can be encoded by a codeword of the first codebook, selecting the codeword associated with the symbol from the first codebook; and
  (c) in case the symbol cannot be encoded by a codeword of the first codebook:
    (c.1) selecting a codeword from the first codebook indicating that the symbol cannot be encoded by a codeword of the first codebook,
    (c.2) splitting the symbol into a plurality of first sub-symbols, each of the first sub-symbols comprising a predefined number of values of the original symbol, and selecting a codeword for each of the first sub-symbols from a second codebook,
  wherein the encoded symbol is represented only by the codeword selected in step (b) from the first codebook, or by the codeword selected in step (c.1) from the first codebook and the plurality of codewords selected in step (c.2) from the second codebook; and
an output for providing an output signal comprising the symbol.

16. A system for transmitting a symbol, from a transmitter to a receiver, the system comprising:
an encoder comprising:
  an input for receiving an input signal comprising a symbol;
  an encoder circuit for encoding the symbol from the input signal, wherein the encoder circuit is configured to encode the symbol, wherein encoding the symbol comprises:
    (a) determining whether the symbol can be encoded by a codeword of a first codebook;
    (b) in case the symbol can be encoded by a codeword of the first codebook, selecting the codeword associated with the symbol from the first codebook; and
    (c) in case the symbol cannot be encoded by a codeword of the first codebook:
      (c.1) selecting a codeword from the first codebook indicating that the symbol cannot be encoded by a codeword of the first codebook,
      (c.2) splitting the symbol into a plurality of first sub-symbols, each of the first sub-symbols comprising a predefined number of values of the original symbol, and selecting a codeword for each of the first sub-symbols from a second codebook,
    wherein the encoded symbol is represented only by the codeword selected in step (b) from the first codebook, or by the codeword selected in step (c.1) from the first codebook and the plurality of codewords selected in step (c.2) from the second codebook; and
  an output for providing an output signal comprising the selected codewords representing the symbol;
a transmitter coupled to the encoder;
a communication link coupled to the transmitter;
a receiver coupled to the communication link; and
a decoder coupled to the receiver, the decoder comprising:
  an input for receiving an input signal comprising a plurality of codewords representing a symbol;
  a decoder circuit for decoding the codewords from the input signal, wherein the decoder circuit is configured to decode the codewords, wherein decoding the received codewords comprises:
    (a) determining whether a first codeword can completely represent the symbol using a first codebook;
    (b) in case the first codeword can completely represent the symbol using the first codebook, selecting the symbol from the first codebook using the first codeword; and
    (c) in case the first codeword cannot completely represent the symbol using the first codebook,
      selecting a second codebook for decoding first sub-symbols of the symbol, wherein each of the first sub-symbols comprises a predefined number of values the original symbol, and
      selecting an entry for each of the first sub-symbols from the second codebook using a second codeword,
    wherein the symbol is represented by the values associated only with the codeword from the first codebook, or associated with a combination of the codeword selected from the first codebook and the plurality of codewords selected from the second codebook an output for providing an output signal comprising the symbol.

17. A non-transitory computer-readable medium having stored thereon a computer program having computer executable instructions for performing a method for encoding an original symbol comprising a plurality of values, the method comprising:
  (a) determining whether the symbol can be encoded by a codeword of a first codebook;
  (b) in case the symbol can be encoded by a codeword of the first codebook, selecting the codeword associated with the symbol from the first codebook; and
  (c) in case the symbol cannot be encoded by a codeword of the first codebook:
    (c.1) selecting a codeword from the first codebook indicating that the symbol cannot be encoded by a codeword of the first codebook,
    (c.2) splitting the symbol into a plurality of first sub-symbols, each of the first sub-symbols comprising a predefined number of values of the original symbol, and selecting a codeword for each of the first sub-symbols from a second codebook,
  wherein the encoded symbol is represented only by the codeword selected in step (b) from the first codebook, or by the codeword selected in step (c.1) from the first codebook and the plurality of codewords selected in step (c.2) from the second codebook.

18. A non-transitory computer-readable medium having stored thereon a computer program having computer executable instructions for performing a method for decoding an original symbol comprising a plurality of values and being encoded by one or more codewords, the method comprising:
  (a) determining whether a first codeword can completely represent the symbol using a first codebook;
  (b) in case the first codeword can completely represent the symbol using the first codebook, selecting the symbol from the first codebook using the first codeword; and
  (c) in case the first codeword cannot completely represent the symbol using the first codebook,
    selecting a second codebook for decoding first sub-symbols of the symbol, wherein each of the first sub-symbols comprises a predefined number of values the original symbol, and
    selecting an entry for each of the first sub-symbols from the second codebook using a second codeword, wherein the symbol is represented by the values associated only with the codeword from the first codebook, or associated with a combination of the codeword selected from the first codebook and the plurality of codewords selected from the second codebook.

* * * * *